US012769365B2

(12) United States Patent
Doglio et al.

(10) Patent No.: US 12,769,365 B2
(45) Date of Patent: Oct. 20, 2026

(54) ELECTRICAL ARCHITECTURE FOR A MODULAR INFORMATION HANDLING SYSTEM

(71) Applicant: DELL PRODUCTS L.P., Round Rock, TX (US)

(72) Inventors: Jean Doglio, Round Rock, TX (US); Jon Isom, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 353 days.

(21) Appl. No.: 18/635,199

(22) Filed: Apr. 15, 2024

(65) Prior Publication Data

US 2025/0321619 A1 Oct. 16, 2025

(51) Int. Cl.

| | |
|---|---|
| ***G06F 1/16*** | (2006.01) |
| ***G06F 1/20*** | (2006.01) |
| ***G06F 13/10*** | (2006.01) |
| ***H05K 5/00*** | (2006.01) |
| ***H05K 5/02*** | (2006.01) |
| ***H05K 7/20*** | (2006.01) |

(52) U.S. Cl.

CPC .......... *G06F 1/1637* (2013.01); *G06F 1/1681* (2013.01); *G06F 1/1683* (2013.01); *G06F 1/203* (2013.01); *G06F 13/10* (2013.01); *H05K 5/0026* (2013.01); *H05K 5/0086* (2013.01); *H05K 5/0226* (2013.01); *H05K 5/0247* (2013.01); *H05K 7/20136* (2013.01)

(58) Field of Classification Search

CPC .... G06F 1/1637; G06F 1/1681; G06F 1/1683; G06F 1/203; G06F 13/10; G06F 1/1616; H05K 5/0026; H05K 5/0086; H05K 5/0226; H05K 5/0247; H05K 7/20136

USPC ........... 439/79, 502, 505; 361/749, 776, 789

See application file for complete search history.

(56) References Cited

U.S. PATENT DOCUMENTS

| | | | | |
|---|---|---|---|---|
| 5,650,910 A * | 7/1997 | Winick | G06F 1/183 | 439/67 |
| 6,175,504 B1 * | 1/2001 | Hood, III | G06F 1/1616 | 439/31 |
| 6,885,549 B2 * | 4/2005 | Thomason | H05K 1/0228 | 174/268 |
| 7,907,230 B2 * | 3/2011 | Goto | G06F 1/1635 | 361/679.27 |

(Continued)

FOREIGN PATENT DOCUMENTS

WO WO-2024025341 A1 * 2/2024 ........... G06F 1/1683

*Primary Examiner* — Tulsidas C Patel
*Assistant Examiner* — Thomas K Quigley
(74) *Attorney, Agent, or Firm* — Larson Newman, LLP

(57) ABSTRACT

An information handling system includes top and base portions, and a flex circuit cable. The top portion includes a first set of components. The base portion includes a main board and a second set of components. The flex circuit cable is in physical communication with the first components, with the main board, and with the second components, The flex circuit cable includes first, second, and third connectors. The first connector in physical communication with one of the first components in the top portion. The second connector is in physical communication with the main board in the base portion and is positioned as a horizontal plugin connector. The third connector is in physical communication with one of the second components in the base portion and is a vertical connector.

20 Claims, 5 Drawing Sheets

(56) References Cited

U.S. PATENT DOCUMENTS

| | | | | |
|---|---|---|---|---|
| 8,043,115 | B2 * | 10/2011 | Zieger | H05K 1/189<br>439/502 |
| 8,727,805 | B2 * | 5/2014 | Giustina | G06F 1/1624<br>439/505 |
| 9,507,388 | B1 * | 11/2016 | Hampton | G06F 1/1637 |
| 9,681,586 | B2 | 6/2017 | Bailey et al. | |
| 9,781,825 | B2 * | 10/2017 | Farkas | H05K 1/0225 |
| 10,700,459 | B1 * | 6/2020 | Farkas | H01R 12/79 |
| 11,983,048 | B2 * | 5/2024 | Choi | G06F 1/1637 |
| 12,114,420 | B2 * | 10/2024 | Cheng | G02F 1/133334 |
| 12,149,092 | B2 * | 11/2024 | Choi | G06F 1/203 |
| 12,279,375 | B2 * | 4/2025 | Torres | H05K 1/028 |
| 12,416,957 | B2 * | 9/2025 | Teeter | H04L 12/10 |
| 2009/0167978 | A1 * | 7/2009 | Goto | G06F 1/1684<br>349/58 |
| 2009/0168384 | A1 * | 7/2009 | Goto | H05K 1/147<br>361/803 |
| 2009/0169982 | A1 * | 7/2009 | Goto | G06F 1/1616<br>429/100 |
| 2010/0331060 | A1 * | 12/2010 | Yoshida | H01R 35/00<br>174/254 |
| 2012/0202375 | A1 * | 8/2012 | Giustina | G06F 1/1624<br>439/505 |
| 2014/0108692 | A1 * | 4/2014 | Doglio | G06F 1/183<br>361/679.02 |
| 2015/0070856 | A1 * | 3/2015 | Wada | H05K 1/147<br>361/749 |
| 2022/0129047 | A1 * | 4/2022 | Schwager | G06F 1/1683 |
| 2022/0137668 | A1 * | 5/2022 | Schwager | G06F 1/1654<br>361/679.27 |
| 2022/0304189 | A1 * | 9/2022 | Luo | H05K 7/20336 |
| 2023/0038719 | A1 * | 2/2023 | Hyun | G06F 1/1647 |
| 2023/0168721 | A1 * | 6/2023 | Tsen | G06F 3/03547<br>345/156 |
| 2023/0185332 | A1 * | 6/2023 | Morrison | G06F 11/3093<br>361/679.1 |
| 2023/0269874 | A1 * | 8/2023 | Kim | H05K 1/117<br>361/749 |
| 2023/0318181 | A1 * | 10/2023 | Ho | H01Q 1/2266 |
| 2024/0032233 | A1 | 1/2024 | Alvarado et al. | |
| 2024/0292542 | A1 * | 8/2024 | Torres | H05K 1/028 |
| 2025/0321619 | A1 * | 10/2025 | Doglio | G06F 1/1616 |
| 2025/0324532 | A1 * | 10/2025 | Doglio | G06F 1/1616 |
| 2025/0328174 | A1 * | 10/2025 | Doglio | G06F 1/203 |
| 2026/0003396 | A1 * | 1/2026 | Chang | G06F 1/1635 |
| 2026/0126835 | A1 * | 5/2026 | Wang | G06F 1/1616 |

* cited by examiner

ELECTRICAL ARCHITECTURE FOR A MODULAR INFORMATION HANDLING SYSTEM

FIELD OF THE DISCLOSURE

The present disclosure generally relates to information handling systems, and more particularly relates to an electrical architecture for a modular information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes top and base portions, and a flex circuit cable. The top portion includes a first set of components. The base portion includes a main board and a second set of components. The flex circuit cable may be in physical communication with the first components, with the main board, and with the second components, The flex circuit cable includes first, second, and third connectors. The first connector may be in physical communication with one of the first components in the top portion. The second connector may be in physical communication with the main board in the base portion and is positioned as a horizontal plugin connector. The third connector may be in physical communication with one of the second components in the base portion and is a vertical connector.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
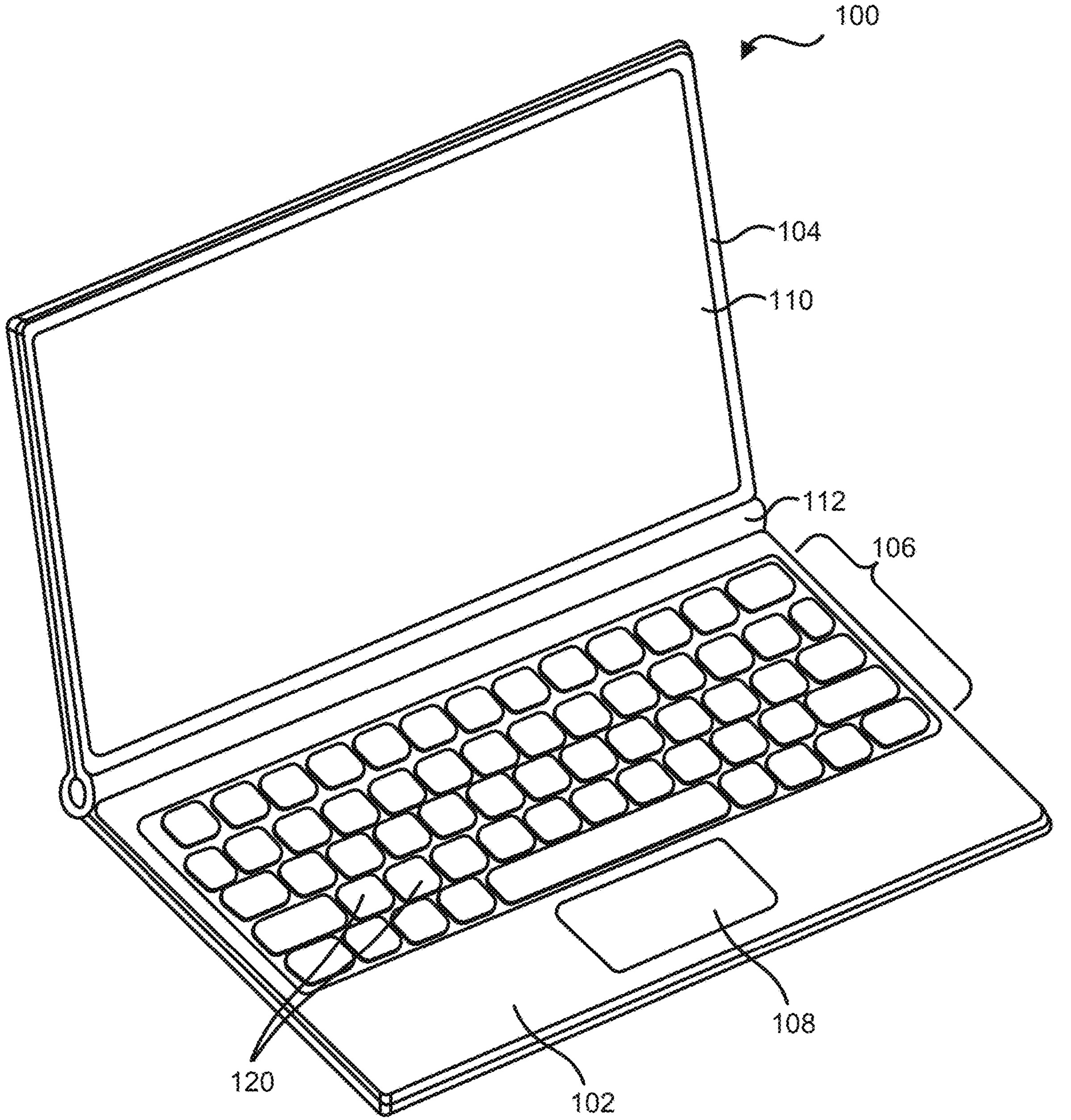
FIG. 1 is a perspective via of a diagram of an information handling according to at least one embodiment of the present disclosure.

FIG. 1 illustrates an information handling system 100 according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), server (such as a blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Information handling system 100 includes a base portion 102 and a top 104. Base portion 102 includes a keyboard 106 and a touchpad 108, and top portion 104 includes a display device 110. In an example, touchpad 108 may be any suitable pointing device. Base portion 102 is connected top portion 104 via a mechanism 112, such as one or more hinges. Keyboard 106 includes multiple keys 120. When the information handling system 100 comprises a 2-in-1 device, mechanism 112 may enable the top portion 104 to be connected to base portion 102 for use as a laptop device and may enable the top portion 104 to be detached from base portion 102 to enable the top portion 104 to be used as a tablet information handling system. Display device 110 may include one or more light emitting devices, such as, for example, light emitting diodes (LEDs), organic LED (OLED), liquid crystal display (LCD), another type of light emitting device, or any combination thereof.

Figure 2:
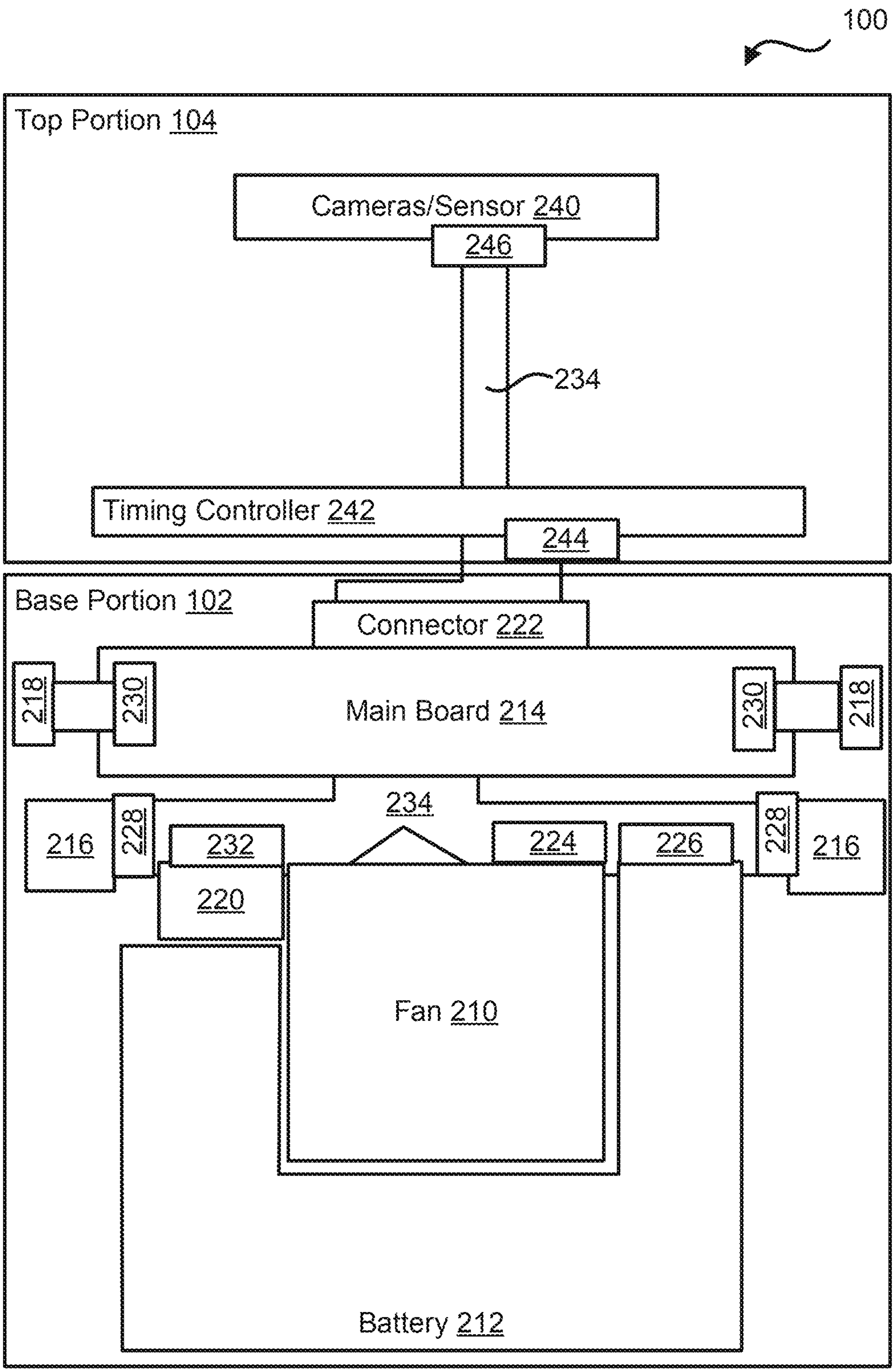
FIG. 2 is a block diagram of a portion of an information handling system according to at least one embodiment of the present disclosure.

FIG. 2 illustrates a portion of information handling system 100 according to at least one embodiment of the present disclosure. Base portion 102 of information handling system 100 includes a fan 210, a battery 212, a main board 214, speakers 216, input/output (I/O) ports 218, and keyboard 220. Base portion 102 also includes multiple connectors 222, 224, 226, 228, 230, and 232. In an example, information handling system 100 includes a flex circuit cable 234 to connect components within base portion 102 with components within top portion 104. Top portion 104 includes cameras/sensors 240, a timing controller 242, connectors 244 and 246, and other components. In an example, flex circuit cable 234 may extend from base portion 102 to top portion 104 via the hinge of information handling system 100. In this example, flex circuit cable 234 may be able to bend with the movement of the hinge without breaking. Thus, flex circuit cable 234 may enable communication between the components in base portion 102 and top portion 104 without the connection being broken during the movement of the hinge. Information handling system 100 may include additional components without varying from the scope of this disclosure.

Figure 6:
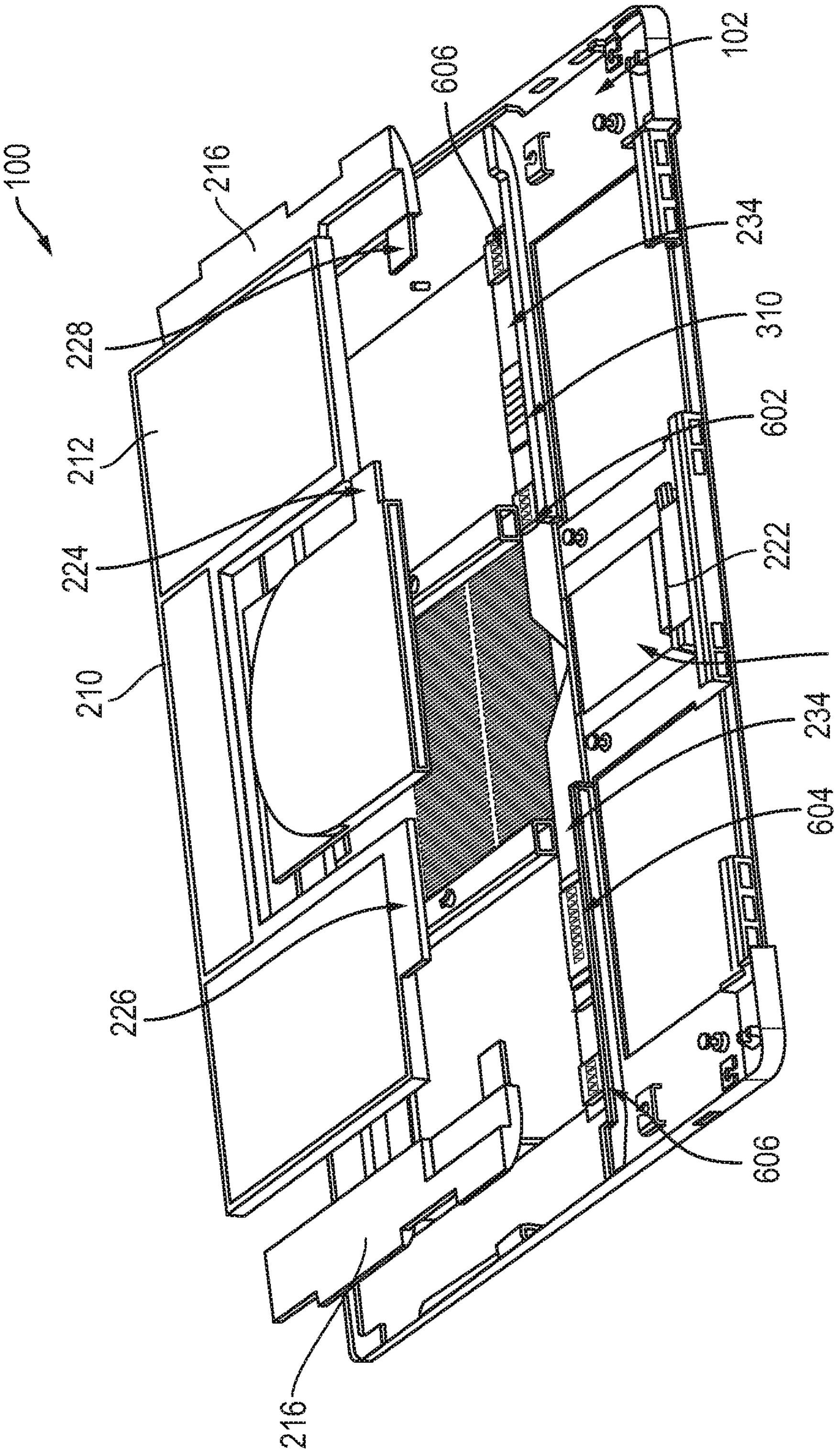
FIG. 6 is an exploded view of components in an information handling system according to an embodiment of the present disclosure.

In an example, flex circuit cable 234 may connect all the components within base portion 102 and within top portion 104. In certain examples, flex circuit cable 234 may include multiple vertical blind mate interfaces as shown in FIG. 6. These vertical blind mate interfaces may enable easy assembly/disassembly of internal components of information handling system 100, which in turn may allow the components to be customer replacement units (CRUs) within information handling system 100. Thus, flex circuit cable 234 may create a modular environment within information handling system 100, such that the different components may be replaced or swapped for other components to create different architectures of the information handling system. In an example, main board or motherboard 214 may communicate with fan 210, battery 212, speakers 216, cameras/sensors 240, and timing controller 242 via flexible circuit cable 234. While only a single flex circuit cable 234, information handling system 100 may include additional flex circuit cables without varying from the scope of this disclosure. In an example, the components within information handling system 100 may utilize standard, high-level interfaces with flex circuit cable 234 to minimize pin count and allow flexibility for future versions of the peripherals.

In certain examples, each of the components within information handling system 100 may utilize a different connector to interface with flex circuit cable 234. For example, main board 214 may utilize connector 222, fan 210 may utilize connector 224, battery 212 may utilize connector 226, each speaker 216 may utilize a different connector 228, keyboard 220 may utilize connector 232, timing controller 242 may utilize connector 244, and cameras/sensor 240 may utilize connector 246. The components may communicate with one another via their respective connectors and flex circuit cable 234. In certain examples, I/O ports 218 may connect to main board 214 via different cables and connectors 230, such that the I/O ports do not directly interface with flex circuit cable 234. In an example, main board 214 may connect and communicate with all components of information handling system 100 that are not located on the main board itself via connector 222 and flex circuit cable 234.

In an example, fan 210 may provide an airflow through base portion 102 to provide thermal cooling to battery 212, main board 214, and the other components within the base portion. In certain examples, battery 212 may provide power to fan 210, main board 214, speakers 216, keyboard 220, cameras/sensors 240, timing controller 242, and other components within information handling system 100 via flex circuit cable 234.

Figure 3:
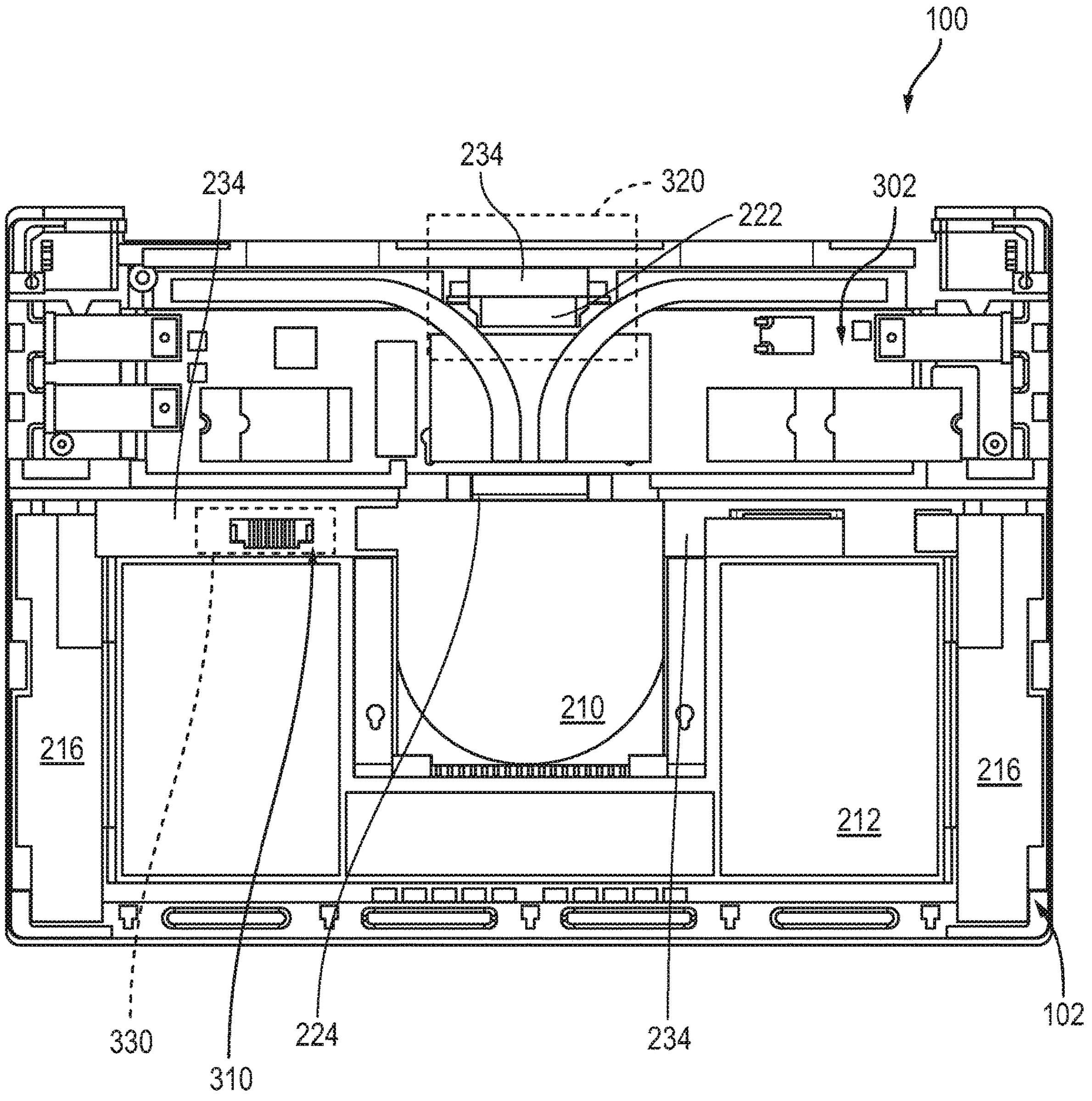
FIG. 3 is a diagram of internal components of an information handling system according to at least one embodiment of the present disclosure.

FIG. 3 illustrates a portion of information handling system 100 according to at least one embodiment of the present disclosure. Information handling system 100 includes a carrier frame 302, which in turn may hold or support main board 214. Information handling system 100 also includes a surface mount interface 310 along flex circuit cable 234. In an example, surface mount interface 310 may be any suitable type of interface including, but not limited to, a drop and slide blind mate compression spring interface. Information handling system 100 may include additional interfaces as will be described with respect to FIG. 6 below.

As illustrated in FIG. 3, flex circuit cable 234 may extend over a back wall of base portion 102. In an example, the routing of flex circuit cable 234 may cause or enable connector 222 to extend perpendicular to the back wall of base portion 102, such that main board 214 on carrier frame 302 may plug into the connector. In certain example, flex circuit cable 234 may substantially wider than its is thick. These dimensions of flex circuit cable 234 may enable the flex circuit cable to be located in between a bottom surface of base portion 102 and the components within the base portion without adding a substantial thickness to the base portion. A portion 320 of information handling system 100 will be described with respect to FIG. 4 below. Also, a portion 330 of information handling system 100 will be described with respect FIG. 5 below.

Figure 4:
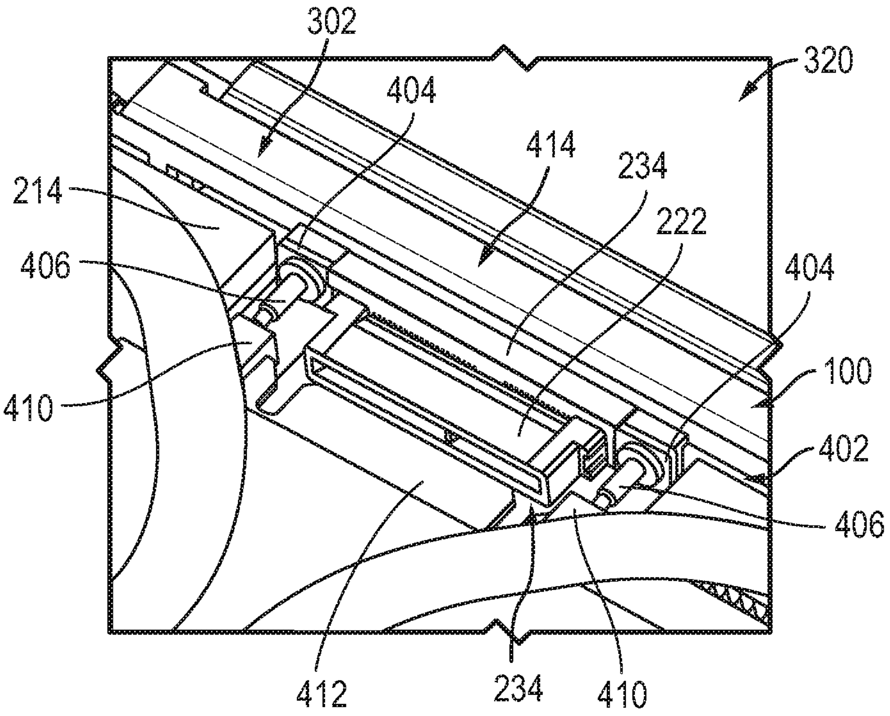
FIG. 4 is a diagram of a portion of an information handling system including a chassis base connector according to at least one embodiment of the present disclosure.

FIG. 4 illustrates portion 320 of information handling system 100 according to at least one embodiment of the present disclosure. Information handling system 100 includes back wall 402 of base portion 102, backing plates 404, and alignment posts 406. Information handling system 100 also includes alignment components 410 on carrier frame 302, a connector 412 of main board 214, and a back surface 414 of the carrier frame.

In an example, connector 222 may be secured to flex circuit cable 234 in any suitable manner. For example, connector 222 may be soldered, clamped, or the like to flex circuit cable 234. When carrier frame 302 is mounted within base portion 102, back surface 414 of the carrier frame may be placed in physical communication with back wall 402 of the base portion. In this situation, flex circuit cable 234 may be located in between back wall 402 of base portion 102 and back surface 414 of carrier frame 302 to secure the flex circuit cable and connector 222 in a particular position such as between alignment posts 406.

In certain examples, backing portions 404 may be different ends of a single back portion or may be separate back portions. Backing portions 404 may be any suitable material to support alignment posts 406. For example, backing portions 404 may be a printed circuit board, metal, or the like. Alignment posts 406 may extend from backing portions 404 in substantially the same direction as connector 222 to enable proper alignment between connector 412 and connector 222.

In an example, each alignment component 410 may include a respective hole to receive a respective one of alignment posts 406. In certain examples, frame carrier 302 may drop into base portion 102 may slide horizontally to create a horizontal blind mate connection between connectors 212 and 412. In an example, when connector 414 of main board 214 is in physical and electrical communication with connector 222 on flex circuit cable 234, main board 214 may be able to communicate with the other components of information handling system 100.

Figure 5:
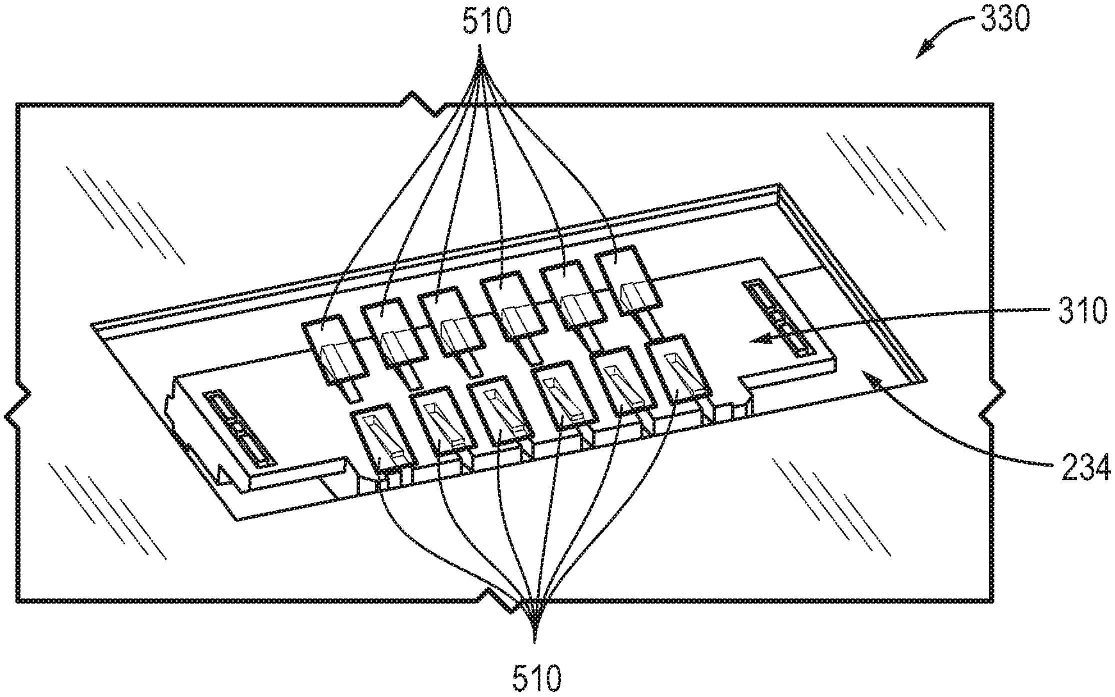
FIG. 5 is a diagram of contact pads for a connector of an information handling system according to an embodiment of the present disclosure.

FIG. 5 illustrates portion 330 of information handling system 100 according to an embodiment of the present disclosure. Connector 310 includes multiple mounting pads 510. As shown in FIG. 5, connector 232 may be mounted on flex circuit cable 234. Mounting pads 510 may be placed in physical communication with connector 232 of keyboard 220 of FIG. 2. In an example, when connector 232 of keyboard 220 of FIG. 2 is in physical communication with mounting pads 510 of connector 310, the keyboard may communicate with main board 214 of FIG. 2 via flex circuit cable 234. In certain examples, other surface mount connectors on flex circuit cable 234 may include mounting pads that are substantially similar mounting pads 510.

FIG. 6 illustrates an exploded view of base portion 102 information handling system 100 according to an embodiment of the present disclosure. In an example, flex circuit cable 234 includes multiple surface mount connectors 602, 604, and 606. Flex circuit cable 234 may extend from connector 222 along a surface of base portion 102 for a particular distance and split into two pieces beyond the particular distance. In an example, the particular distance may be any suitable length including, but not limited to, the width of an area in base portion 102 that carrier frame 302 and main board 214 of FIG. 3 are located when inserted within the base portion.

In an example, one piece or section of flex circuit cable 234 may extend toward one edge of base portion 102 and the other piece or section of the flex circuit cable may extend toward an opposite edge of the base portion. In certain examples, flex circuit cable 234 may be rectangular and may be folded to change the direction of the flex circuit cable. For example, when flex circuit cable 234 is beyond the location of carrier frame 302 and main board 214 of FIG. 3, the flex circuit cable may be folded to create left and right-reaching legs in base portion 102 as illustrated in FIG. 6. Connectors 310, 602, 604, and 606 may be located at different locations along one or the other sections of flex circuit cable 234. For example, connectors 602, 310, and one of connectors 606 may be located along one section of flex circuit cable 234, and connectors 604 and the other connector 606 may be located along the other section of the flex circuit cable.

In certain example, connectors 602, 604, and 606 may include connecting pads that are substantially similar to pads 510 of connector 310 illustrated in FIG. 5. In an example, connectors 602, 604, and 606 may have spring compression interfaces to connect with corresponding components of information handling system 100. For example, when fan 210 is inserted within base portion 102, connector 224 of the fan may form a blind mate spring interface with connector 602 of flex circuit cable 234. Similarly, when battery 212 is inserted within base portion 102, connector 226 of the battery may form a blind mate spring interface with connector 604 of flex circuit cable 234. When each of speakers 216 is inserted within base portion 102, corresponding connector 228 of the speaker may form a blind mate spring interface with corresponding connector 606 of flex circuit cable 234. In certain examples, connectors 602, 604, 606, and 310 may be any suitable type of connector including, but not limited to, surface mount connectors, pogo pin connectors, and spring compression connectors.

In an example, when connector 224 of fan 210 is in physical and electrical communication with connector 602, the fan may communicate with main board 214 of FIG. 2 via flex circuit cable 234. Similarly, when connector 228 of each speaker 216 is in physical and electrical communication with corresponding connector 606, the speaker may communicate with main board 214 of FIG. 2 via flex circuit cable 234. When connector 226 of battery 212 is in physical and electrical communication with connector 604, the battery may provide power to fan 210, speakers 216, keyboard 220, and to main board 214 of FIG. 2 via flex circuit cable 234. In certain examples, the routing and connectors 222, 310, 602, 604, and 606 of flex circuit cable 234 may enable each component of information handling system 100 to be removed from and connected within the information handling system individually, such that only one component may need to be removed at a time. For example, fan 210 may be disconnected from connector 602 on flex circuit cable 234 and the other components, such as main board 214 of FIG. 2, battery 212, speakers 216, cameras/sensors 240, and timing controller 242 of FIG. 2 may continue to be plugged in and communicate with other components of information handling system 100 via flex circuit cable 234.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:

a top portion including a first plurality of components;

a base portion in physical communication with the top portion, the base portion including a main board and a second plurality of components; and a flex circuit cable in physical communication with the first components, with the main board, and with the second components, the flex circuit cable including:

a first connector in physical communication with one of the first components in the top portion;

a second connector in physical communication with the main board in the base portion, wherein the second connector is positioned as a horizontal plugin connector; and a third connector in physical communication with one of the second components in the base portion, wherein the third connector is a vertical connector.

2. The information handling system of claim 1, wherein the flex circuit cable extends a particular distance from a back wall of the base portion, wherein the flex circuit cable splits into first and second sections beyond the particular distance.

3. The information handling system of claim 2, wherein the flex circuit cable is rectangular to enable the first section to fold over and extend toward a first edge of the base portion, and enable the second section to fold over and extend toward a second edge of the base portion.

4. The information handling system of claim 3, wherein the first and second edges are opposite edges of the base portion.

5. The information handling system of claim 2, where the second connector is mounted on the back wall of the base portion.

6. The information handling system of claim 2, where the third connector is located on the first section of the flex circuit cable.

7. The information handling system of claim 1, wherein the main board connects with and is configured to communicate with the one of the second plurality of components via the second connector, the third connector, and the flex circuit cable.

8. The information handling system of claim 1, wherein the top portion is connected to the base portion by a hinge portion to enable the top portion to rotate with respect to the bottom portion.

9. The information handling system of claim 8, wherein the flex circuit cable extends from the base portion through the hinge portion to the top portion.

10. An information handling system comprising:

a top portion including a first plurality of components;

a base portion in physical communication with the top portion, the base portion including a main board and a second plurality of components; and a flex circuit cable in physical communication with the first components, with the main board, and with the second components, wherein the flex circuit cable extends a particular distance from a back wall of the base portion, wherein the flex circuit cable splits into first and second sections beyond the particular distance, wherein the flex circuit cable extends from the base portion through a hinge portion to the top portion, the flex circuit cable including:

a first connector in physical communication with one of the first components in the top portion;

a second connector in physical communication with the main board in the base portion, wherein the second connector is positioned as a horizontal plugin connector; and a third connector in physical communication with one of the second components in the base portion, wherein the third connector is a vertical connector.

11. The information handling system of claim 10, wherein the first section extends toward a first edge of the base portion, and the second section extends toward a second edge of the base portion.

12. The information handling system of claim 11, wherein the first and second edges are opposite edges of the base portion.

13. The information handling system of claim 10, where the second connector is mounted on the back wall of the base portion.

14. The information handling system of claim 10, where the third connector is located on the first section of the flex circuit cable.

15. The information handling system of claim 10, wherein the base portion is a main chassis of a laptop computer and the top portion includes a display device.

16. The information handling system of claim 10, wherein the top portion is connected to the base portion by the hinge portion to enable the top portion to rotate with respect to the bottom portion.

17. An information handing system comprising:

a top portion including a first plurality of components;

a base portion in physical communication with the top portion, the base portion including a main board and a second plurality of components;

a fan to provide an airflow through the base portion; and a flex circuit cable in physical communication with the first components, with the main board, and with the second components, the flex circuit cable including:

a first connector in physical communication with one of the first components in the top portion;

a second connector in physical communication with the main board in the base portion, wherein the second connector is positioned as a horizontal plugin connector;

a third connector in physical communication with the fan, wherein the main board is configured to communicate with the fan via the second connector, the flex cable, and the third connector; and a fourth connector in physical communication with a battery of the information handling system, wherein the battery is configured to provide power to the main board, the components of the top portion, and the fan via the flex circuit cable, wherein the third and fourth connectors are vertical connectors.

18. The information handing system of claim 17, wherein the flex circuit cable extends a particular distance from a back wall of the base portion, wherein the flex circuit cable splits into first and second sections beyond the particular distance.

19. The information handing system of claim 17, wherein the top portion is connected to the base portion by a hinge portion to enable the top portion to rotate with respect to the bottom portion.

20. The information handing system of claim 19, wherein the flex circuit cable extends from the base portion through the hinge portion to the top portion.

* * * * *